(12) United States Patent
Kilpatrick

(10) Patent No.: US 6,218,879 B1
(45) Date of Patent: Apr. 17, 2001

(54) S-R FLIP-FLOP CIRCUIT

(75) Inventor: Michael Thomas Kilpatrick, Cherry Hinton (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 09/266,892

(22) Filed: Mar. 12, 1999

(51) Int. Cl.[7] .................................................. H03K 3/037
(52) U.S. Cl. ............................ 327/217; 327/223; 327/208
(58) Field of Search ..................................... 327/199, 208, 327/214, 215, 217, 223, 576, 581; 377/79

(56) References Cited

U.S. PATENT DOCUMENTS

| 4,806,786 | * | 2/1989 | Valentine | 327/203 |
|---|---|---|---|---|
| 4,825,100 | * | 4/1989 | Caspell | 327/208 |
| 5,095,225 | * | 3/1992 | Usui | 327/211 |
| 5,208,487 | * | 5/1993 | Matsuura et al. | 327/208 |
| 5,604,456 | * | 2/1997 | Nitta | 327/217 |

* cited by examiner

*Primary Examiner*—Tuan T. Lam
*Assistant Examiner*—Hai L. Nguyen
(74) *Attorney, Agent, or Firm*—Nixon & Vanderhye P.C.

(57) ABSTRACT

An S-R flip-flop circuit is provided using two stacks of gates 2, 6 with an internal signal Int stored therebetween. Feedback from the output O is used to switch the state of the internal signal Int in a manner that provides an edge-triggered response for at least one of the inputs.

20 Claims, 3 Drawing Sheets

S-R FLIP-FLOP CIRCUIT

BACKGROUND OF THE INVENTION

1. Field of the Invention

This invention relates to the field of digital circuits. More particularly, this invention relates to S-R flip-flop circuits.

2. Description of the Prior Art

It is known to provide so-called S-R flip-flop circuits of various forms. An S-R flip-flop circuit classically has the behavior that the output goes high when the set input goes high and the output goes low when the reset input goes high. Within this behavior, it will be appreciated that the inputs may also be used in their complementary form to achieve similar behavior if this is appropriate. Furthermore, the inputs can be either level sensitive or edge-triggered. Different types of S-R flip-flop are appropriate in different circumstances. In some circumstances, edge-triggered input behavior is desirable to avoid problems due to potentially conflicting inputs and to provide more predictable behavior.

Within the field of digital circuits it is a general objective to seek to make the circuits using few gates and to make the circuits operate quickly. Measures that assist towards these objectives are strongly desirable.

SUMMARY OF THE INVENTION

Viewed from one aspect the present invention provides an S-R flip-flop circuit comprising:

(i) a first signal input for receiving a first input signal having a signal value of either A or B;

(ii) a second signal input for receiving a second input signal having a signal value of either C or D;

(iii) an output signal node bearing an output signal having a signal value of either E or F;

(iv) an internal node bearing an internal signal having a signal value of either G or H;

(v) a first stack of gates responsive to said output signal and said first input signal; and (vi) a second stack of gates responsive to said internal signal, said first input signal and a second input signal, said internal node being between said first stack of gates and said second stack of gates; wherein (vii) said first stack of gates forces said internal signal to G (0) when said first input signal is A (1) and said output signal is E (1) and said first stack of gates forces said internal signal to H (1) when said first input signal is B (0) and said output signal is F (0);

(viii) said second stack of gates forces said output signal to F (0) when said internal signal is G (0) and said first input signal is B (0), whereby (ix) when said output signal is E (1) and said first input signal is A (1), said internal signal will be G (0) and a transition in said first signal from A (1) to B (0) will force said output signal to transition from E (1) to F (0) followed by said internal signal being forced to transition from G (0) to H (1), thereby effecting an edge-triggered change in said output signal from E (1) to F (0) in response to said first input signal changing from A (1) to B (0).

The invention provides an S-R flip-flop circuit that exhibits edge-triggered behavior on at least one of its inputs whilst requiring the use of relatively few gates and incurring relatively few gate delays in its operation.

In order to improve the stability and reliability of the circuit it is desirable to include level holding circuits for maintaining both the internal signal and the output signal.

As mentioned above, the invention provides at least one edge-triggered input. If level sensitive behavior is required for the second input then this may be achieved in embodiments in which said second stack of gates is responsive to said second input signal to force said output signal to E when said second input signal is A independent of said internal signal or said first input signal. With such embodiments it is important that certain restrictions are imposed upon the states that may be adopted by the inputs in order to avoid excessive current flow within the circuit.

If edge-triggered behavior is required for both inputs, then this may be achieved in embodiments including a further internal node bearing a further internal signal having a signal value of either I or J; and a third stack of gates responsive to said output signal and said second input signal; wherein said second stack of gates is also responsive to said further internal signal, said further internal node being between said first stack of gates and said second stack of gates;

said third stack of gates forces said further internal signal to I (0) when said second input signal is C (1) and said output signal is E (1) and said third stack of gates forces said further internal signal to J (1) when said second input signal is D (0) and said output signal is F (0);

said second stack of gates forces said output signal to E (1) when said further internal signal is J (1) and said second input signal is C (1), whereby when said output signal is F (0) and said second input signal is D (0), said further internal signal will be J (1) and a transition in said second signal from D (0) to C (1) will force said output signal to transition from F (0) to E (1) followed by said further internal signal being forced to transition from J (1) to I (0), thereby effecting an edge-triggered change in said output signal from F (0) to E (1) in response to said second input signal changing from B (0) to C (1).

The various stacks of gates can be conveniently provided by a stack of field effect transistors (FETs) in series between a supply voltage source and a ground voltage source. In the context of the invention the number of series field effect transistors is not too large as to cause problems due to voltage drop along the stack.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
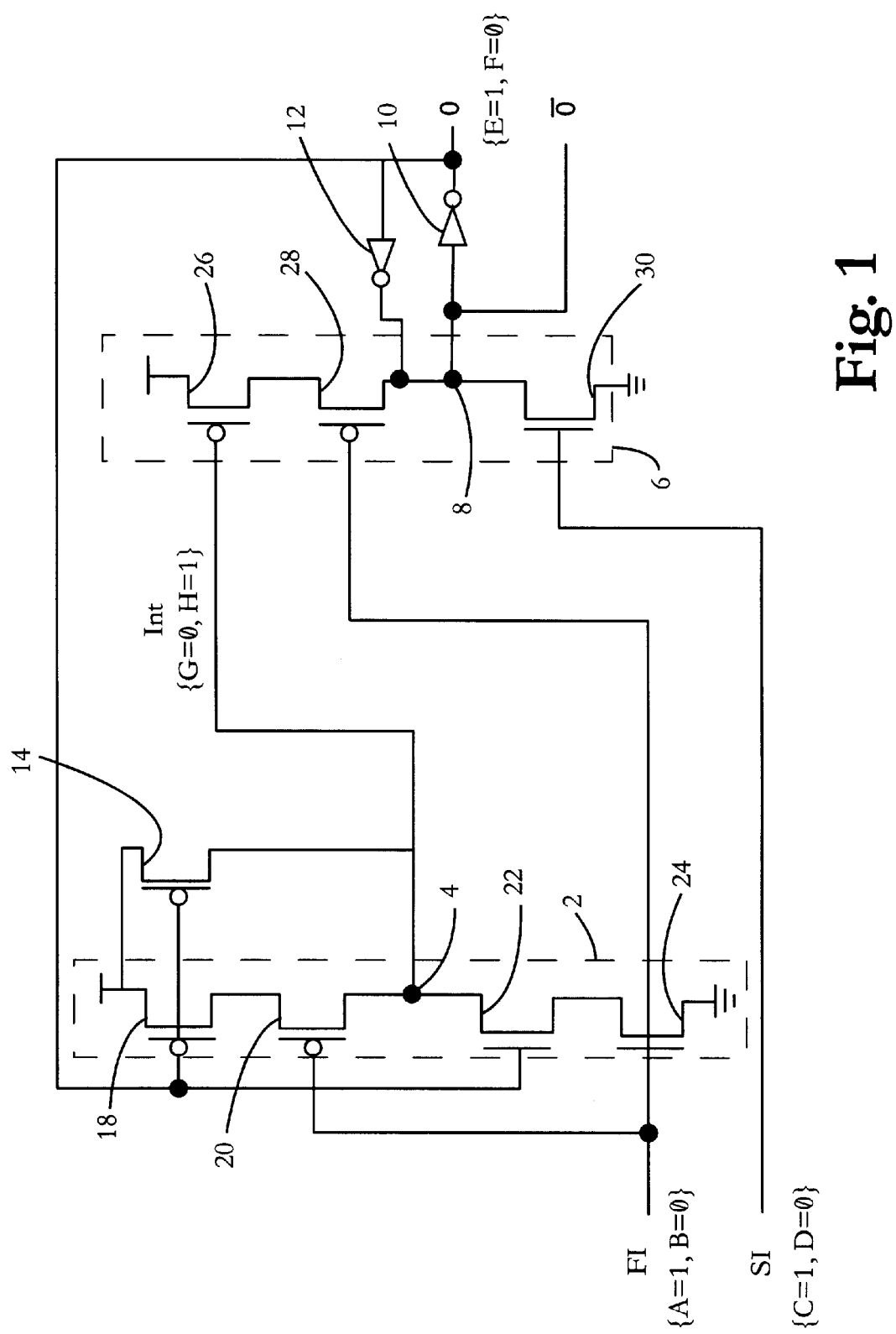
FIG. 1 shows an S-R flip-flop circuit showing edge-triggered behavior for its first input and level sensitive behavior for its second input.

FIG. 1 shows an S-R flip-flop circuit having a first input FI, a second input SI and an output O. The first input FI has either a signal value of A (high=1) or B (low=0). The output O has a signal value of either E (high) or F (low). The second input SI has a signal value of either C (high) or D (low).

A first stack of gates 2 is formed of four FETs in series 18, 20, 22, 24 between a supply voltage source (Vdd=1=high) and a ground voltage source (0=low). An internal signal node 4 is provided at the mid point of the stack of gates 2 between FETs 20 and 22. The FETs 18 and 20 are switched off when their gate input is high and are switched on when their gate input is low. Conversely, the FETs 22 and 24 are switched on when their gate input is high and are switched off when their gate input is low. A second stack of gates 6 is formed of three FETs in series 26, 28 and 30 between the supply voltage (Vdd=1=high) and a ground voltage source (0=low). An internal signal Int from the internal node 4 switches FET 26. The internal signal Int can have a signal value G (low) or H (high).

The output O is derived from a signal at an output node 8 between the FETs 28 and 30 within the second stack of gates 6 via an invertor 10.

A weak feedback invertor 12 serves to latch the output O. A weak FET 14 serves to latch the internal signal Int when it is high to guard against the signal being lost through current leakage and the like.

In operation, the second input SI (e.g a set signal) serves to force the output O high when the second input SI is high irrespective of any other signals. This is the result of the FET 30 being made conductive by the second input SI being high and so grounding the output signal node 8. Grounding of the output signal node 8 forces the output O high by virtue of the action of the invertor 10.

When the output O is high and the first input FI (e.g. a complement of a reset signal) is high, then the internal signal Int will be forced low by virtue of the FETs 22 and 24 within the first stack of gates 2 being conductive.

If the first input FI now transitions from a high value to a low value (i.e. an edge transition occurs), then this will isolate the internal signal node 4 from the ground voltage source as well as switching on the middle FET 28 within the second stack of gates 6. The FET 26 in the second stack of gates 6 will already be conductive by virtue of the internal signal Int being low, and so the transition within the first input FI will cause the output node 8 to be coupled to the supply voltage source causing the output node 8 to go high. The transition in the first input FI reaches the output O via only two switching delays, i.e. the FET 28 and the invertor 10.

It will be appreciated that during this time the second input SI must be low such that the FET 30 in the second stack of gates 6 is non-conductive. If this is not the case, then a low resistance path may be set up through all three of the FETs 26, 28 and 30 within the second stack of gates 6 between the supply voltage source and the ground voltage source. This could cause excessive current flow and malfunction.

When the output signal node 8 transitions high, the invertor 10 reacts to this by forcing the output O low. This transition in the output O is then fedback to the first stack of gates 2. Within the first stack of gates 2 the output O becoming low serves to switch the FET 18 to a conductive state. The first input FI is already low rendering FET 20 conductive and so the internal signal node 4 will be coupled to the supply voltage source driving it high. This will in turn isolate the output signal node 8 from the supply voltage source within the second stack of gates 6 by switching FET 26 to a non-conductive state. Isolating the output signal node 8 from the supply with the second stack of gates yields the edge-triggered nature of the first input FI, i.e. the state of the first input FI is no longer relevant once the output signal node 8 has transitioned from low to high and the internal signal node 4 has transitioned high.

A weak FET 14 switch by the output O is provided to latch the high level on the internal signal node 4.

If the second input SI is a set input and the first input FI is the complement of a reset input, then the circuit of FIG. 1 provides the function of an edge-triggered reset and a level sensitive set S-R flip-flop circuit.

Figure 2:
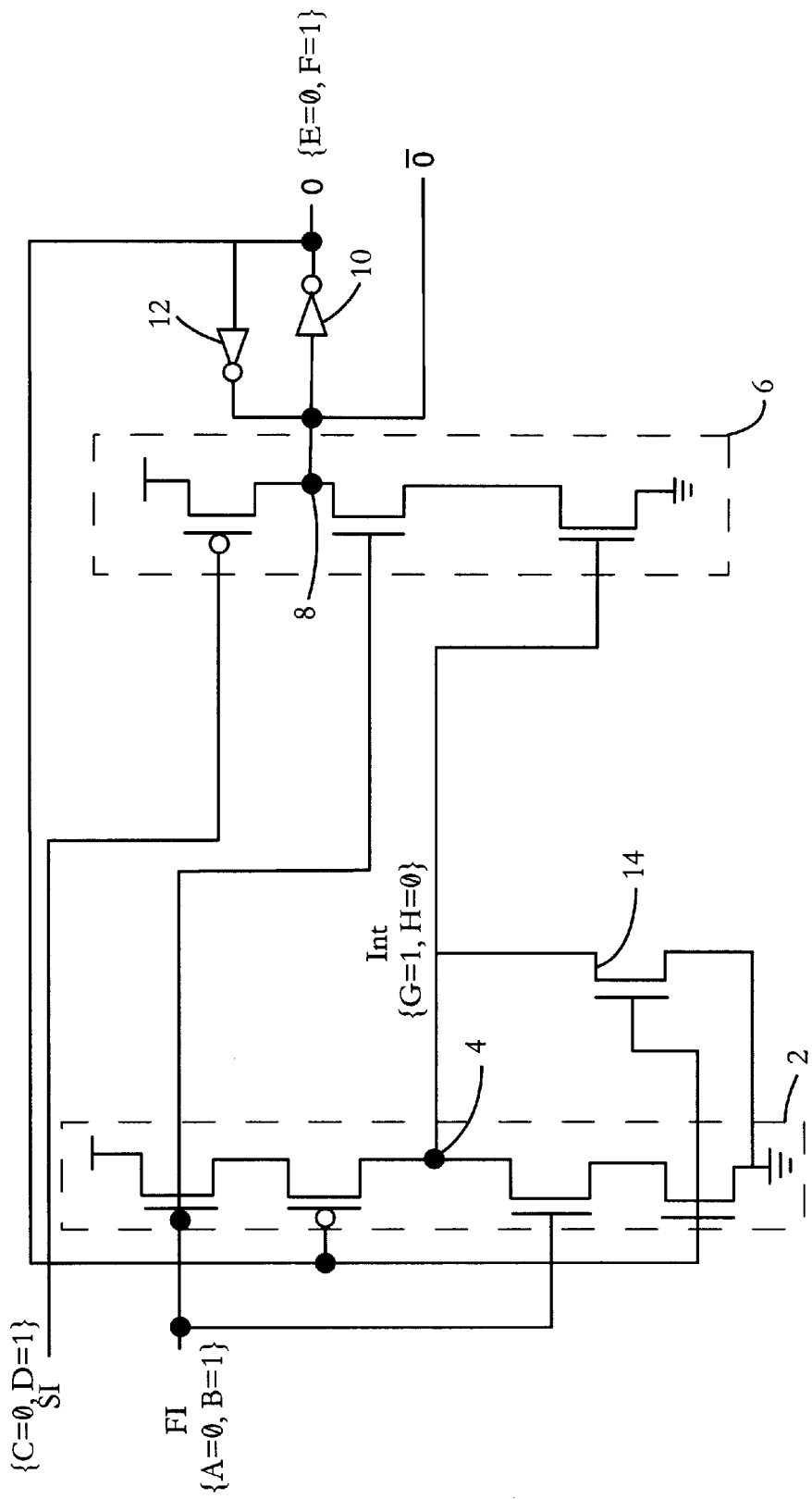
FIG. 2 shows another S-R flip-flop circuit having edge-triggered behavior for its first input and level sensitive behavior for its second input.

FIG. 2 illustrates an alternative embodiment of an S-R flip-flop circuit. Compared to FIG. 1, the N-channel FETs have become P-channel FETs and the P-channel FETs have become N-channel FETs. This also results in an inversion of all the signal levels relative to the circuit of FIG. 1. Another way of viewing this is that the circuit of FIG. 1 has been mirrored about a horizontal axis along which lie the internal signal node 4 and the output signal node 8. In operation, the output O is driven low by the second input SI being low irrespective of other inputs. If the first input FI transitions from low to high, then this causes the second stack of gates 6 to couple the output signal node 8 to the ground voltage source forcing it low. This in turn forces the output O high. The output O going high then serves to control the internal signal node 4 to be coupled to the ground voltage source thereby driving the internal signal Int low. This action provides edge-triggered operation in dependence upon the first input FI going from low to high. If the first input FI is a set input and the second input SI is the complement of a reset input, then the S-R flip-flop circuit of FIG. 2 provides edge triggered set and level sensitive reset operation.

Figure 3:
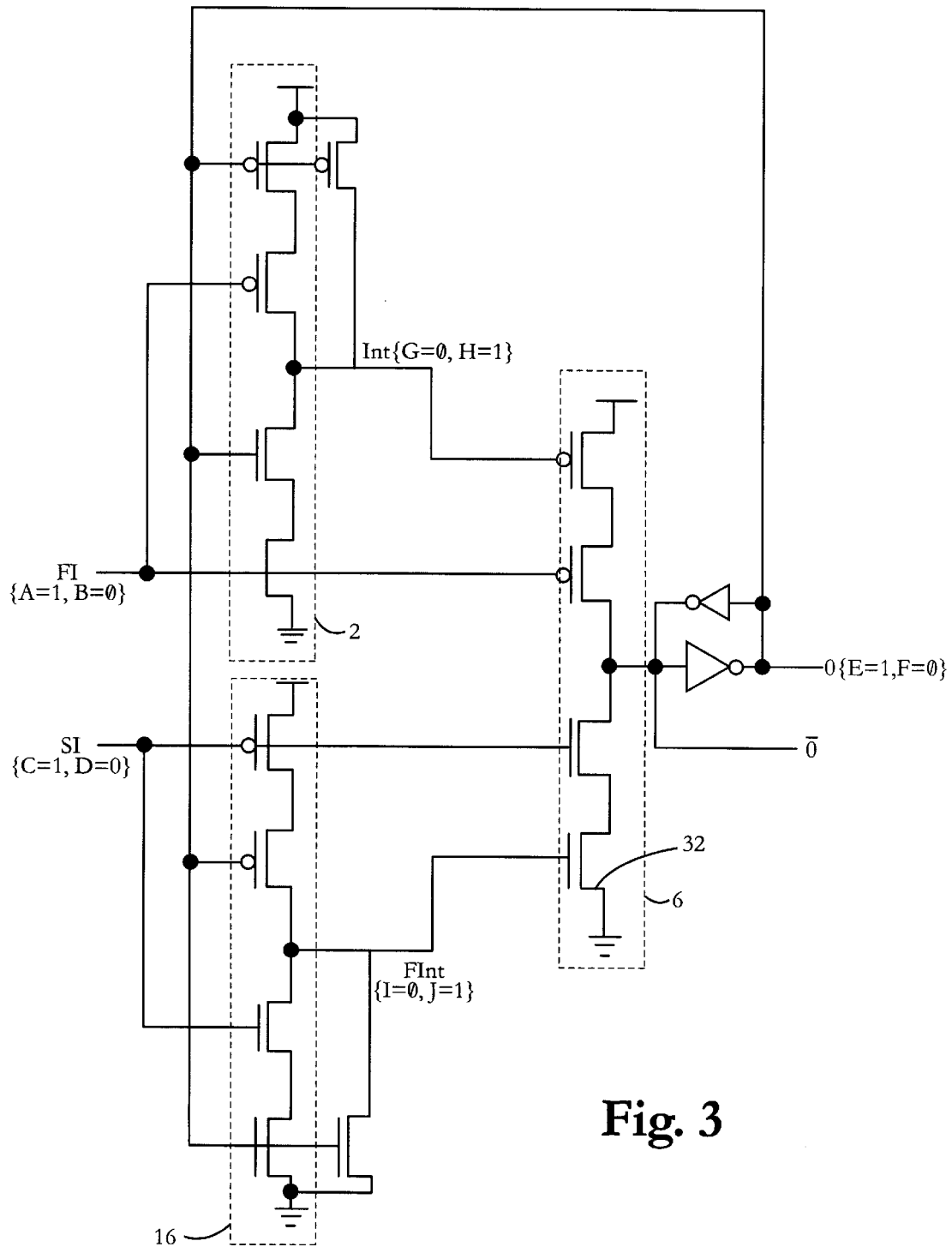
FIG. 3 shows an S-R flip-flop circuit having edge-triggered behavior for both its first input and its second input.

FIG. 3 illustrates a third S-R flip-flop circuit. This is effectively a combination of the circuits of FIG. 1 and FIG. 2 to provide-edge-triggered reset via the first input FI and edge triggered set via the second input SI. A third stack of gates 16 is provided compared to the circuit of FIG. 1. Furthermore, the second stack of gates 6 has an extra FET 32 compared to the FIG. 1 embodiment. An internal signal Int used in the edge-triggering of the reset operation is provided between the first stack of gates 2 and the second stack of gates 6. A further internal signal FInt is provided between the third stack of gates 16 and the second stack of gates 6 to allow edge-triggering of the set operation.

The circuit of FIG. 3 uses eighteen gates (an invertor uses two gates) including all the signal level maintaining circuits. This compares favorably to conventional S-R flip-flop circuits that may typically use twenty eight gates to achieve the same functionality. Furthermore, the delay in the output O responding to a change in the input is only two gate delays (the relevant gate within the second stack of gates 6 and the invertor). This compares favorably to other circuits. It will be appreciated that typical processing clock speeds within, for example, microprocessors, provide a clock period that corresponds to only twenty gate delays and so the switching time of a single S-R flip-flop circuit can be a significant constraining factor in increasing performance.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

What is claimed is:

1. An S-R flip-flop circuit comprising:
   (i) a first signal input for receiving a first input signal having a signal value of either A or B;
   (ii) a second signal input for receiving a second input signal having a signal value of either C or D;

(iii) an output signal node bearing an output signal having a signal value of either E or F;
(iv) an internal node bearing an internal signal having a signal value of either G or H;
(v) a first stack of gates responsive to said output signal and said first input signal; and
(vi) a second stack of gates responsive to said internal signal, said first input signal and said second input signal, said internal node being between said first stack of gates and said second stack of gates; wherein
(vii) said first stack of gates forces said internal signal to G when said first input signal is A and said output signal is E and said first stack of gates forces said internal signal to H when said first input signal is B and said output signal is F;
(viii) said second stack of gates forces said output signal to F when said internal signal is G and said first input signal is B, whereby
(ix) when said output signal is E and said first input signal is A, said internal signal will be G and a transition in said first signal from A to B will force said output signal to transition from E to F followed by said internal signal being forced to transition from G to H, thereby effecting an edge-triggered change in said output signal from E to F in response to said first input signal changing from A to B.

2. An S-R flip-flop circuit as claimed in claim 1, comprising an internal signal level holding circuit for maintaining said internal signal at a signal value when said output node is undriven.

3. An S-R flip-flop circuit as claimed in claim 1, comprising an output signal level holding circuit for maintaining said output signal at a signal value when said output node is undriven.

4. An S-R flip-flop circuit as claimed in claim 1, wherein said second stack of gates is responsive to said second input signal to force said output signal to E when said second input signal is A independent of signals values of said internal signal or said first input signal.

5. An S-R flip-flop circuit as claimed in claim 1, wherein said first input signal transitioning from A to B whilst said second input signal is C is forbidden.

6. An S-R flip-flop circuit as claimed in claim 1, further comprising:
a further internal node bearing a further internal signal having a signal value of either I or J; and
a third stack of gates responsive to said output signal and said second input signal; wherein
said second stack of gates is also responsive to said further internal signal, said further internal node being between said first stack of gates and said second stack of gates;
said third stack of gates forces said further internal signal to I when said second input signal is C and said output signal is E and said third stack of gates forces said further internal signal to J when said second input signal is D and said output signal is F;
said second stack of gates forces said output signal to E when said further internal signal is J and said second input signal is C, whereby
when said output signal is F and said second input signal is D, said further internal signal will be J and a transition in said second signal from D to C will force said output signal to transition from F to E followed by said further internal signal being forced to transition from J to I, thereby effecting an edge-triggered change in said output signal from F to E in response to said second input signal changing from B to C.

7. An S-R flip-flop circuit as claimed in claim 6, comprising a further internal signal level holding circuit for maintaining said further internal signal at a signal value when said further internal signal node is undriven.

8. An S-R flip-flop circuit as claimed in claim 1, wherein said first stack of gates comprises a stack of field effect transistors arranged in series between a supply voltage source and a ground voltage source and each being switched by a respective one of said first input signal and said output signal.

9. An S-R flip-flop circuit as claimed in claim 8, wherein said internal signal node is coupled to a midpoint of said first stack of gates.

10. An S-R flip-flop circuit as claimed in claim 1, wherein said second stack of gates comprises a stack of field effect transistors arranged in series between a supply voltage source and a ground voltage source and each being switched by a respective one of said first input signal, said second input signal and said internal signal.

11. An S-R flip-flop circuit as claimed in claim 10, wherein said output signal node is coupled to a midpoint of said second stack of gates.

12. An S-R flip-flop circuit as claimed in claim 6, wherein said third stack of gates comprises a stack of field effect transistors arranged in series between a supply voltage source and a ground voltage source and each being switched by a respective one of said second input signal and said output signal.

13. An S-R flip-flop circuit as claimed in claim 12, wherein said further internal signal node is coupled to a midpoint of said third stack of gates.

14. An S-R flip-flop circuit as claimed in claim 6, wherein said second stack of gates comprises a stack of field effect transistors arranged in series between a supply voltage source and a ground voltage source and each being switched by a respective one of said first input signal, said second input signal, said internal signal and said further internal signal.

15. An S-R flip-flop circuit as claimed in claim 14, wherein said output signal node is coupled to a midpoint of said second stack of gates.

16. An S-R flip-flop circuit as claimed in claim 1, wherein A is a high signal level and B is a low signal level.

17. An S-R flip-flop circuit as claimed in claim 1, wherein C is a high signal level and D is a low signal level.

18. An S-R flip-flop circuit as claimed in claim 1, wherein E is a high signal level and F is a low signal level.

19. An S-R flip-flop circuit as claimed in claim 1, wherein G is a low signal level and H is a high signal level.

20. An S-R flip-flop circuit as claimed in claim 6, wherein I is a low signal level and J is a high signal level.

* * * * *